United States Patent [19]

Tripsas

[11] Patent Number: 5,789,802
[45] Date of Patent: Aug. 4, 1998

US005789802A

[54] DOPANT PROFILE SPREADING FOR ARSENIC SOURCE/DRAIN

[75] Inventor: Nicholas H. Tripsas, San Jose, Calif.

[73] Assignee: Advanced Micro Devices, Inc., Sunnyvale, Calif.

[21] Appl. No.: 667,570

[22] Filed: Jun. 21, 1996

[51] Int. Cl.$^6$ .............................. H01L 29/67; H01L 29/76; H01L 29/94
[52] U.S. Cl. ........................ 257/607; 257/383; 257/384
[58] Field of Search ............................ 257/607, 382, 257/383, 384

[56] References Cited

U.S. PATENT DOCUMENTS

| | | | |
|---|---|---|---|
| 5,444,282 | 8/1995 | Yamaguchi et al. | 257/382 |
| 5,523,600 | 6/1996 | Kapoor | 257/383 |

FOREIGN PATENT DOCUMENTS

| | | | |
|---|---|---|---|
| 0097533 | 1/1984 | European Pat. Off. | |
| 0 097 533 A2 | 4/1984 | European Pat. Off. | H01L 21/265 |

OTHER PUBLICATIONS

"Effects of ion implantation on formation of TiSi$_2$"; Park et al. Feb. 10, 1984; Journal of Vaccum Science & Technology.

I. Sakai, et al., "A NewSalicide Process (PASET) for Sub-half Micron CMOS," Proc. IEEE 1992 Symposium on VLSI Technology, Digest of Technical Papers, pp. 66–67.

Sang–Jik Kwon, et al., "As+–Preamorphization Method for Shallow p+–n Junction Formation," Japanese Journal of Applied Physics, vol. 29, No. 12, Part 02, 1 Dec. 1990, pp. L2326–L2328.

Patent Abstracts of Japan, vol. 013, No. 097 (E–723), 7 Mar. 1989 & JP 63 271972 A (Sony Corp.), 9 Nov. 1988.

H.K. Park, et al., "Effec of Ion Implantation Doping on the Formation of TiSi2," Journal of Vacuum Science & Technology A, vol. 2, No. 2, Apr.–Jun. 1984, pp. 264–268.

*Primary Examiner*—Wael Fahmy
*Attorney, Agent, or Firm*—Gerald M. Fisher

[57] ABSTRACT

An improved process for forming shallow arsenic-doped source/drain regions in MOS devices utilizes a two-step arsenic implant which lowers the surface arsenic concentration while maintaining sharp junction profile and desired junction depth. Minimizing the excess arsenic in the surface region improves silicidation characteristics.

14 Claims, 5 Drawing Sheets

DOPANT PROFILE SPREADING FOR ARSENIC SOURCE/DRAIN

FIELD OF THE INVENTION

This invention relates to integrated circuit manufacturing processes for forming shallow source/drain implants in MOS devices, and to making silicided contacts to the source/drain regions.

BACKGROUND OF THE INVENTION

Many critical design and manufacturing issues arise as integrated circuits are required to become smaller, faster, and less costly to produce. The formation of shallow source/drain junctions in MOS devices and formation of low resistance ohmic contacts to the source/drains are among these issues.

As device dimensions are scaled down, with channel lengths less than 0.8 microns, shallow source/drain junctions, i.e., depths of 0.2 microns or less, are necessary to maintain adequate device performance. Source/drain regions of MOS devices are generally formed by ion implantation of dopant impurities into the silicon. Usually arsenic or phosphorus are used for NMOS devices and boron for PMOS devices. The source/drain region is characterized by the chemical concentration profile of implanted atoms. The implants extend down to a depth below the silicon surface called the junction depth. As seen in FIG. 1, the preferred source/drain dopant concentration profile would have a constant value from the surface to the junction depth, then would drop sharply to a low value. However, ion implantation profiles are typically not flat. Under idealized implantation conditions they have Gaussian-shaped peaks centered at a depth below the surface called the projected range. Furthermore, implantation conditions are seldom ideal and therefore ion concentration profiles deviate from the above described Gaussian distributions. Channeling is a primary cause of this deviation. Depending on the crystal configuration and the implant angle, certain ions will travel through the silicon lattice without experiencing nuclear collisions with silicon atoms. These ions are said to be channeled. These channeled ions travel a greater distance into the target than do non-channeled ions, and a so called channeling tail is formed to greater depth. This effect becomes more pronounced as the implant energy increases. In the case of a source/drain implant, the channeling tail effectively increases the junction depth. One known method for inhibiting channeling is to implant into or through a partially disordered or completely disordered, i.e. amorphous, layer which disrupts the open channels.

The implantation step is generally followed by a heating step called an anneal which electrically activates the implanted dopants. This is necessary because some of the implanted ions have come to rest between the atoms at so called interstitial locations in the silicon lattice. Upon anneal, the implanted ions move into substitutional sites in the lattice and the dopant ion valence electrons thereby become part of the silicon valence band. Dopants such as boron with valency less than the silicon value of 4 become acceptor sites which provide holes for p-type doping of PMOS devices. Dopants such as arsenic with valency greater than 4 become donor sites which provide excess electrons for n-type doping of NMOS devices.

For a given dopant species at a given temperature, there is a maximum equilibrium concentration of dopant atoms which can be incorporated into substitutional sites in the silicon lattice, this concentration being termed the solid solubility of the dopant in silicon at the given temperature. By way of example, the solid solubility of arsenic in silicon at 900 degrees C is approximated to be in the range of $10^{20}$ atoms per $cm^3$. To achieve optimal current flow characteristics and minimum contact resistance, the electrically active dopant concentration at the surface and into the junction must be maximized, i.e., at or near the solid solubility limit. However, if, for example, the chemical concentration of implanted arsenic at a given range of depth is greater than the arsenic solubility limit for the temperature of the post-implant anneal, then the electrically activated dopant arsenic concentration profile will approach that solubility limit in that depth range, but an excess concentration of electrically inactive arsenic will remain. The electrically inactive arsenic atoms, generally found at interstitial locations rather than substitutional sites, may take the form of arsenic cluster point defects. Under high dose conditions, the clusters may form regions of precipitates. A high arsenic precipitate density and extended defects will affect the carrier mobility and leakage current. The characteristics of contacts to the source/drain regions will also be affected, as described hereinafter.

One crucial issue involved in speeding up integrated circuit response time is contact technology. The metallic interconnects which electrically connect the devices and other circuit elements must in general make stable, reliable, low resistance ohmic contacts to the active semiconductor devices. One widely used low-resistance contact structure for MOS technology incorporates thin layers of low sheet resistance titanium silicide over the polysilicon gate and implanted source/drain regions of the MOS devices. The titanium silicide layer is in general formed by depositing a layer of Ti metal onto the Si surface, then performing a rapid thermal anneal to form a titanium silicide compound, then selectively removing the unsilicided Ti from the surface, leaving a thin titanium silicide layer atop the silicon. The titanium silicide has a much lower sheet resistance than does the underlying silicon, and therefore the contact resistance and parasitic series resistances are lowered when silicided contacts are utilized. Silicide sheet resistance is a function of the silicide thickness, which is determined by the thickness of the deposited Ti layer, assuming that the silicidation reaction proceeds until all of the Ti is consumed. Optimal silicide thicknesses may differ between source/drain and gate regions. Typical silicide thicknesses would be in the range between 200–1000 Angstroms, with sheet resistance of less than 20 ohms per square.

The silicidation reaction is impeded by the presence of excess or precipitated impurities in the surface region of the silicon or at the Ti-silicon interface. This phenomenon has been observed for contacts to arsenic-doped source/drain regions of n-channel devices. Since the source/drain regions are formed before silicidation, the source/drain arsenic has an appreciable impact on the subsequent silicidation reaction.

The effect of excess arsenic on formation of titanium silicide is described by H. K. Park et al., *J. Vac. Sci Tech* A2(2) Apr–June 1994 pp 264–268. As described in this article, arsenic source/drain regions are implanted under varying energy and dose conditions, then a 900 degrees Centigrade post-implant anneal is performed, followed by titanium silicide formation. The sheet resistance ($R_s$) of the silicide layer is found to depend on the arsenic concentration at the titanium/silicon interface. The relatively sharp transition from a high $R_s$ to the minimized $R_s$ is found to occur when the arsenic concentration at the titanium/silicon interface falls below a critical concentration in the mid-to-upper $10^{20}$ cm$^3$ range, regardless of the implant energy and dose. The authors of this paper conclude that the silicidation reaction proceeds until the silicide front meets the critical concentration point, then silicidation stops or is severely retarded. If the arsenic concentration at the Ti/Si interface is above the critical value, silicide formation can be severely limited.

The similarity between the solid solubility of arsenic in silicon and the critical value of maximum arsenic concentration for formation of low sheet-resistance titanium silicide indicates that precipitated or segregated excess As ions play a key role in inhibiting titanium silicide formation. This effect is known and has been addressed mainly by varying energy and dose of the arsenic source/drain implant.

When the standard method of forming the source/drain region with a single arsenic implant is employed, the process variables, dose and energy, can be varied in four combinations as shown in FIGS. 2a–2d. Each combination has advantages and disadvantages. A first combination is the standard low energy (40 KeV) high dose (4e15/cm$^2$) implant (FIG. 2a), which provides the desired junction depth and a sharp drop in arsenic concentration at the junction. A disadvantage of this method is the relatively high excess arsenic concentration near the silicon surface.

A second combination, utilized known in the art, which is utilized, to lower the surface arsenic concentration, employs increased arsenic source/drain implant energy (approx. 80 KeV), as illustrated in FIG. 2b. The implant distribution peak is thereby positioned at a greater depth. The disadvantage of this method is the undesirable increase in junction depth.

A third combination maintains the low energy (40 KeV) implant and lowers the dose to (2e15/cm$^2$) as in FIG. 2c. This provides an alternative method of lowering the silicide sheet resistance. The disadvantage of the method is the increased sheet resistance of the silicon, due to shallow junction depths as small as 500 Å (0.05μ).

Finally, a fourth combination utilizes high energy (80 KeV), low dose (2e15/cm$^2$) implants as shown in FIG. 2d. Deep junctions result, as well as poor contact resistance due to arsenic concentration less than the maximum electrically activated value, i.e., the solubility limit, near the Si surface. Additionally, the high energy implants incur the problem of channeling tails.

The prior art method of performing a single step arsenic source/drain implant, as described heretofore, has disadvantages which cannot be fully overcome, due to the lack of available process variables.

SUMMARY OF THE INVENTION

I have provided an improved process for forming arsenic-doped source/drain regions which yields desired junction depths, sharp junction profiles, and surface arsenic concentration lowered to approximately the solid solubility limit. Using my invention, when silicide contacts are formed following my double implantation, contact silicide sheet resistance is lowered, while good junction characteristics are maintained.

An object of this invention is to provide an improved integrated circuit manufacturing process for forming shallow implanted arsenic source/drain regions in MOS devices, and an MOS device utilizing this process.

A further object of this invention is to provide a process for forming shallow implanted arsenic source/drain regions in MOS devices which yields improved arsenic profiles, and an MOS device utilizing this process.

Another object of this invention is to provide a process for forming shallow implanted arsenic source/drain regions in MOS devices which yields lowered amounts of excess arsenic near the surface, and an MOS device utilizing this process.

A further object of this invention is to provide a process for forming shallow implanted arsenic source/drain regions in MOS devices which yields a flatter chemical concentration profile, and an MOS device utilizing this process.

A further object of this invention is to provide a process for forming shallow implanted arsenic source/drain regions in MOS devices which utilizes a double arsenic implant to optimize the arsenic concentration profile, and an MOS device utilizing this process.

A further object of this invention is to provide a process for forming shallow implanted arsenic source/drain regions in MOS devices which utilizes a first low-energy implant to amorphize the surface region of the Si and a second higher energy deeper arsenic implant having a minimal channeling tail, and an MOS device utilizing this process.

A further object of this invention is to provide a process for forming shallow implanted arsenic source/drain regions in MOS devices which promotes formation of low sheet resistance silicide contacts thereupon, and an MOS device utilizing this process.

DETAILED DESCRIPTION OF THE INVENTION

According to my invention, two separate arsenic source/drain implantations are performed. A chemical dopant concentration profile is obtained which is closer to the desired electrically active profile than can be achieved using a single step implant.

Figure 1:
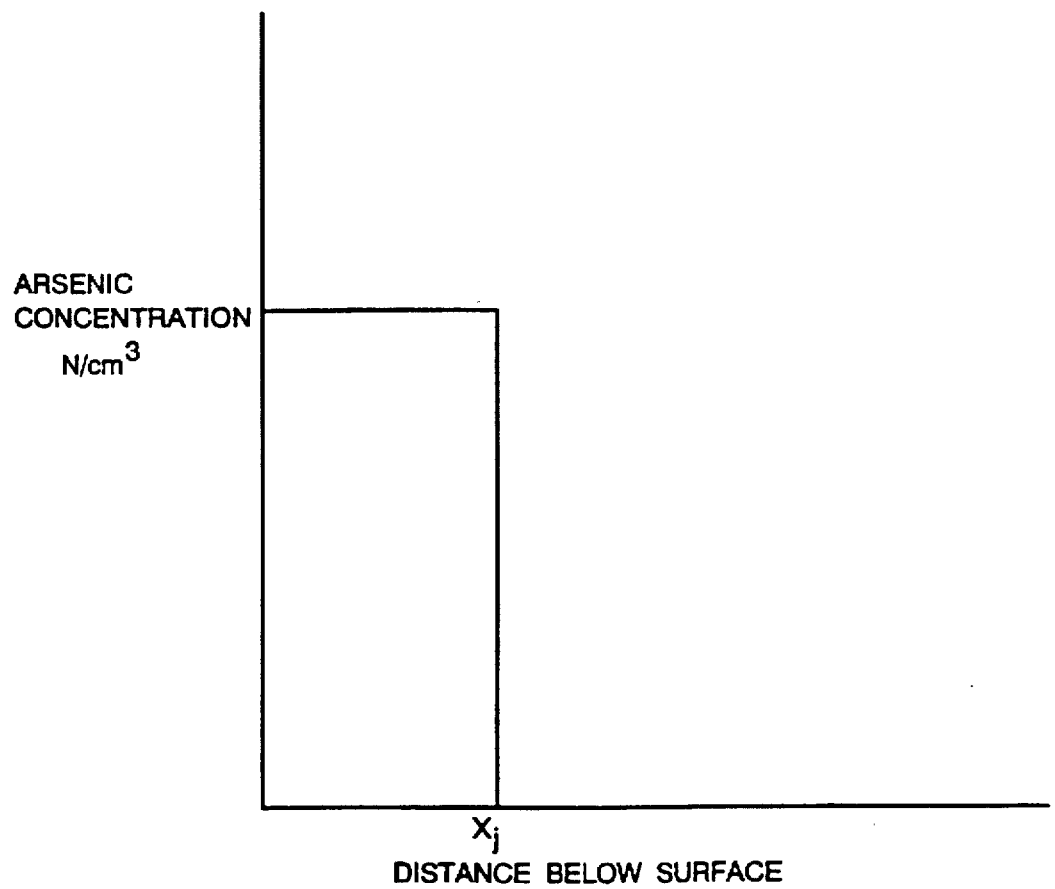
FIG. 1 is a schematic drawing of idealized chemical and electrical dopant concentration profiles of an arsenic doped source/drain region.

FIG. 1 shows an idealized source/drain dopant arsenic concentration profile. Chemical concentration of implanted arsenic is flat for depths down to $X_j$, the junction depth, and falls sharply to negligible levels for depths greater than $X_j$. In this idealized case, the percentage of implanted arsenic atoms which would assume substitutional sites and be electrically activated upon anneal would approach 100%.

FIGS. 2a–2d show diagrams of realistic achievable chemical concentration and electrically active arsenic concentration profiles for a single-step arsenic implant as in prior art. Hereinafter, dose values will be in units of $cm^{-2}$, and concentration values will be in units of $cm^{-3}$.

Figure 2A:
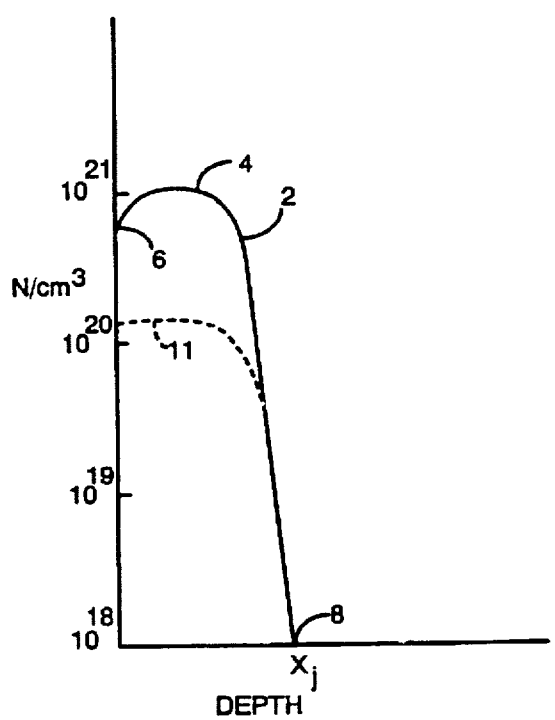
FIG. 2a is a schematic drawing of realistic prior art chemical and electrical dopant profiles of an arsenic source/drain, using a single arsenic implant at low energy and high dose.

FIG. 2a shows an arsenic concentration profile for a single arsenic implant at relatively low energy (approx. 40 KeV) and high dose (approx. 4e15). Chemical concentration profile 2 is Gaussian in shape, with peak 4 positioned approximately 0.05 microns below the silicon surface. Peak chemical concentration value 4 is approximately 1e21, and chemical arsenic concentration 6 at the silicon surface is approximately 9e20. Junction depth 8, $X_j$, is approximately 0.1 microns. Concentration profile 11 of electrically active arsenic atoms following implant anneal at 1050 degrees Centigrade is substantially flat with an approximate concentration of 1.5e20 down to $X_j$. This value represents the solid solubility limit of arsenic in silicon at 1050 degrees Centigrade, and is lower than the chemical concentration for all depths less than $X_j$. The excess arsenic atoms are electrically inactive, and form clusters or precipitates.

Figure 2B:
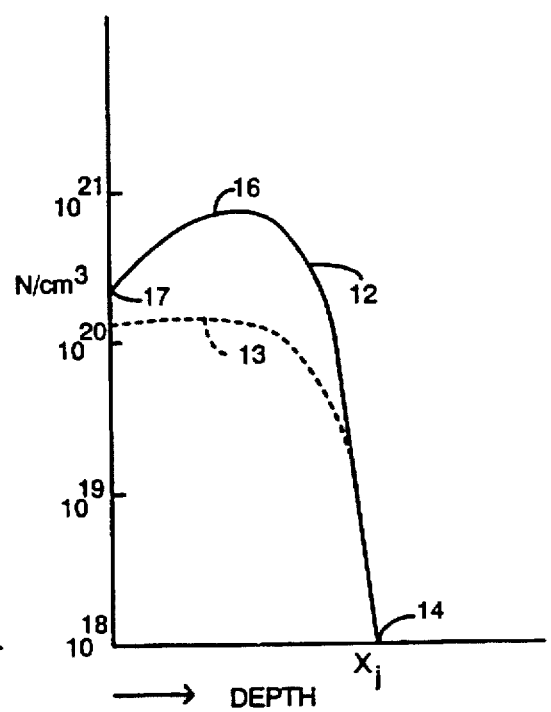
FIG. 2b is a schematic drawing of realistic chemical and electrical dopant profiles of an arsenic source/drain, using a single arsenic implant at high energy and high dose.

FIG. 2b shows diagrams of realistic chemical (12) and electrically active (13) arsenic concentration profiles for a single arsenic implant at high energy (approx. 80 KeV) at similar dose to that of FIG. 2a. The concentration profile 12 is shifted deeper into the substrate, with junction depth 14 $X_j$ being approximately 0.20 microns, and peak 16 being positioned approximately 0–1 microns below the surface. Since peak 16 is further below the surface, chemical arsenic concentration 17 at the surface is lower than for the lower energy implant.

Figure 2C:
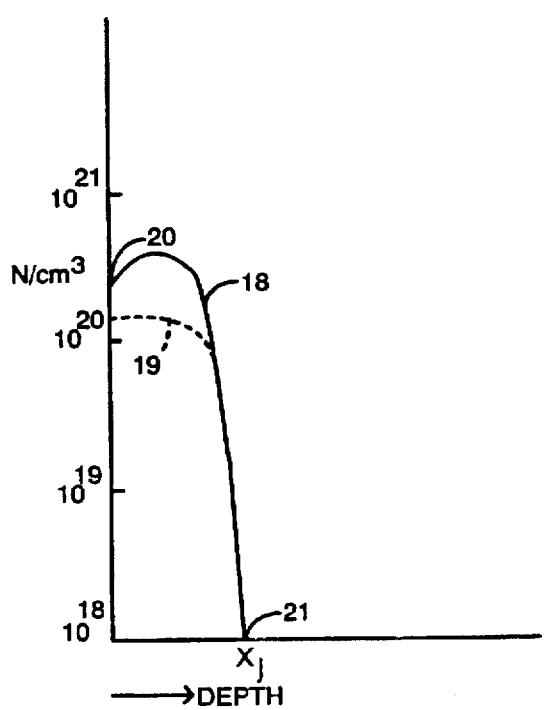
FIG. 2c is a schematic drawing of realistic chemical and electrical dopant profiles of an arsenic source/drain, using a single arsenic implant at low energy and low dose.

FIG. 2c shows diagrams of realistic chemical (18) and electrically active (19) arsenic concentration profiles for a single arsenic implant at low energy of approx. 40 KeV, as in FIG. 2a, and lower dose of approx. 2e15. Arsenic concentration 20 at the surface is lower than for the higher dose case of FIG. 2a, and junction depth 21 $X_j$, approx. 0.05 microns, is shallower than for the high dose implant of FIG. 2a, resulting in unacceptably high sheet resistance of the silicon.

Figure 2D:
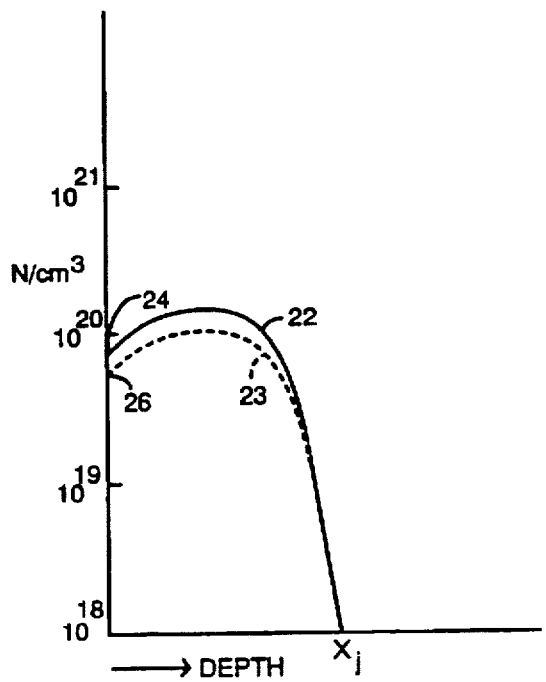
FIG. 2d is a schematic drawing of realistic chemical and electrical dopant profiles of an arsenic source/drain, using a single arsenic implant at high energy and low dose.

FIG. 2d shows diagrams of realistic chemical (22) and electrically active (23) arsenic concentration profiles for a single arsenic implant at high energy of approximately 80 KeV, as in FIG. 2b, and lower dose as in FIG. 2c. In this case, arsenic concentration 24 at the surface is lower than the arsenic solubility limit, therefore lowering the electrically active concentration 26 at the surface, and yielding poor contact resistance.

Figure 3A:
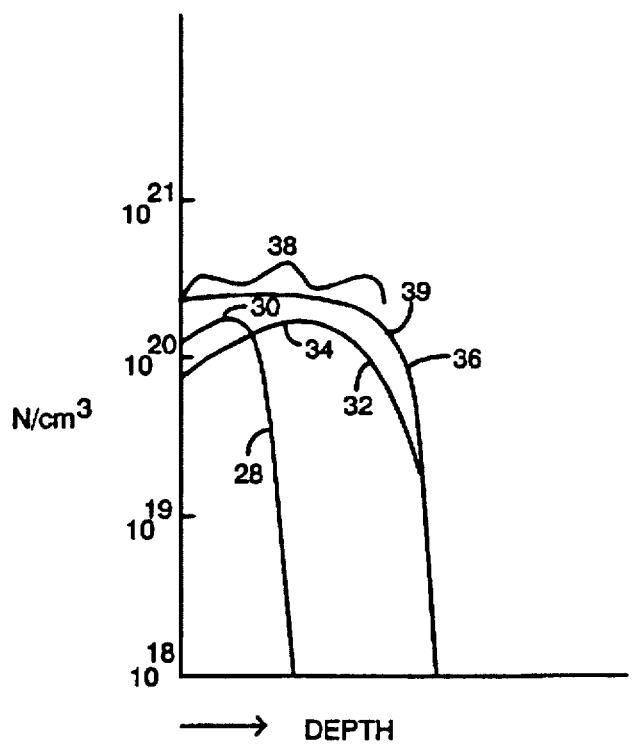
FIG. 3a is a schematic drawing of a chemical arsenic concentration profile for a source/drain region formed by the two step implant process of this invention.
Figure 3B:
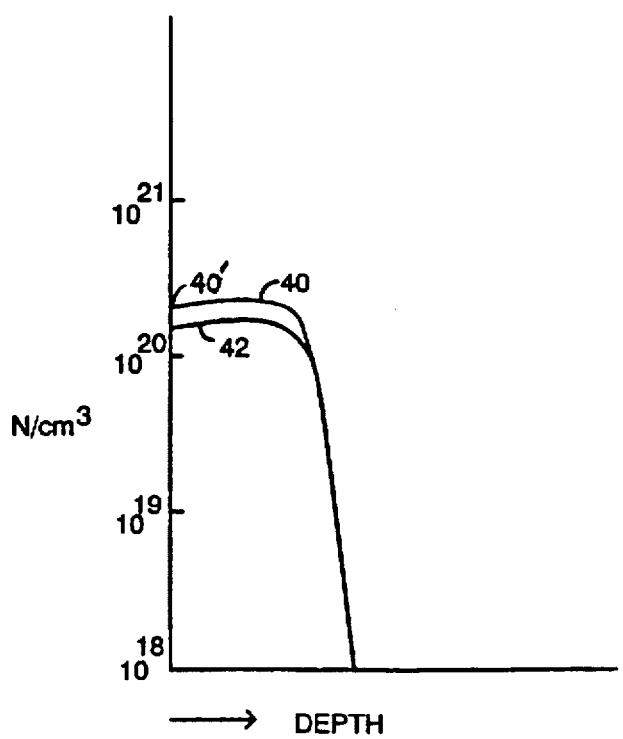
FIG. 3b is a schematic drawing of the chemical arsenic concentration profile of FIG. 3a compared with the electrical concentration profile of the same region after anneal.

FIG. 3a shows a diagram of chemical arsenic concentration profiles for the two source/drain implantations according to my invention. The first implant 28 is a low energy (15 KeV) implant at a dose of 5e14, having peak 30 positioned approximately 0.03 microns below the surface. First implant 28 additionally partially amorphizes the surface region of the silicon. Second implant 32 is a high energy (60 KeV) implant at a dose of 1e15, having peak 34 positioned approximately 0.06 microns below the surface. Due to the partially amorphized surface region, channeling of second implant 32 is reduced. Profile 36 is the chemical concentration sum of first implant 28 and second implant 32. The separation of arsenic concentration peaks 30 and 34 yields a flattened, substantially constant value region 38 in profile 36 having the maximum arsenic concentration therein. This flattened region 38 extends to depth 39, where the arsenic concentration begins to drop sharply. The dropoff point in the arsenic concentration curves will hereinafter be referred to as the "knee" of the curve. Flattened region 38, the high chemical concentration region of the source/drain implant, is thereby spread out relative to the single peaked profiles of single implant source/drains as shown in FIGS. 2a–2d. As shown in FIG. 3b, the double implant energies and doses can be adjusted to provide a chemical profile 40 closer in shape and height to the electrically active profile 42 after anneal.

Utilizing my invention, chemical arsenic concentration 40' at the surface is lower than for the single implant of FIG. 2a, and junction depth $X_j$ is shallower than for the high energy single implant of FIG. 2b. Thus the advantages of both deep and shallow single implants are realized while their disadvantages are largely overcome.

Figure 4A:
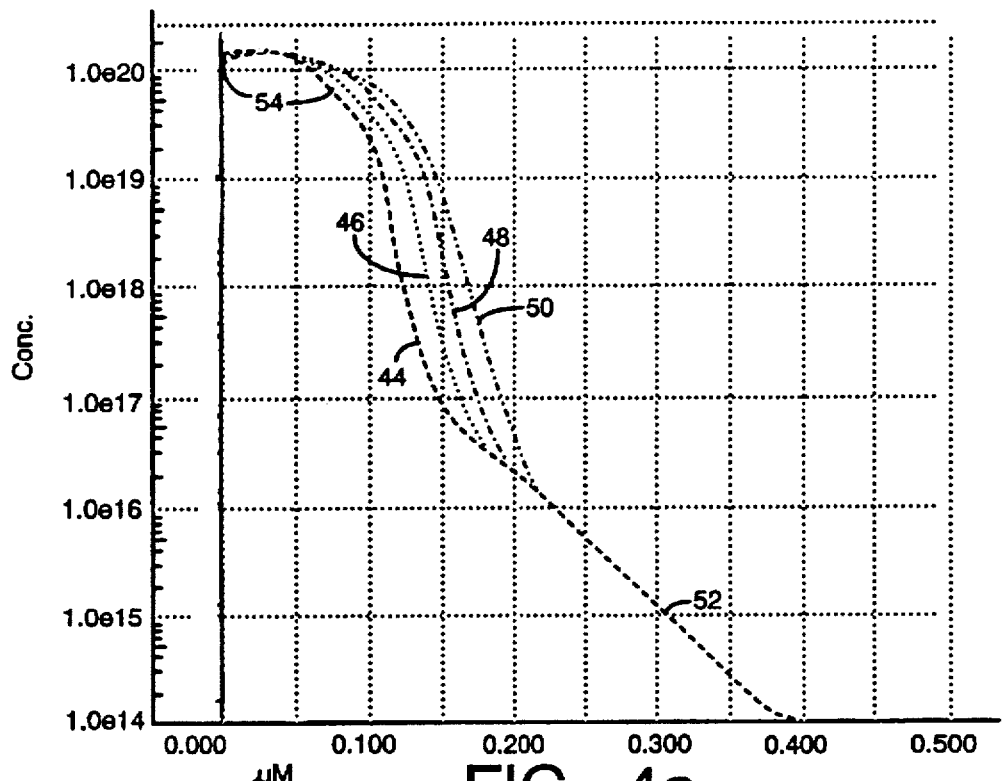
FIG. 4a shows simulated arsenic profiles using the inventive two step implant process with varying dose and energy conditions.
Figure 4B:
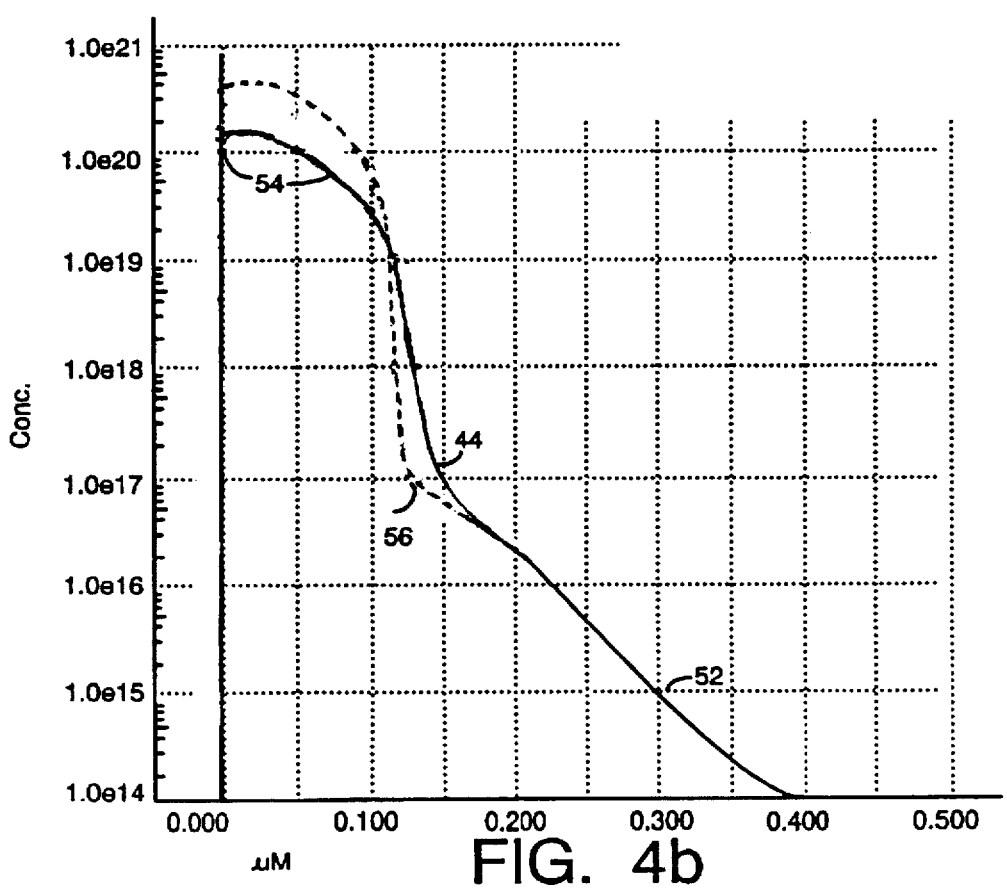
FIG. 4b shows a simulated arsenic profile using the inventive two step implant process compared with a prior art one step implant arsenic profile.

FIGS. 4a and 4b show simulated arsenic source/drain chemical profiles using the two step implant of my invention. The simulations were run using Process Wizard software from Dawn Technologies. The process flow of the simulations is:

1) p-type 20 ohm-cm substrate with 80 Angstroms oxide 2) arsenic LDD implant at 30 KeV energy and 5e13 dose, 0° tilt 3) oxide strip, as in spacer etch 4) regrow 80 Angstroms oxide with $O_2/N_2$ exposure at 875° C. for 61.5 minutes 5) first arsenic implant at dose D1 and energy E1, tilt 7°, twist 40°.

6) second arsenic implant at dose D2 and energy E2, tilt 7°, twist 40°.

7) first Rapid Thermal Anneal (RTA) cycle 1050 ° C. 30 seconds (simulates arsenic implant anneal)

8) second RTA cycle 1000° C. 30 seconds (simulates subsequent boron implant anneal for PMOS devices)

D1 remains fixed at 5e14 and D2 remains fixed at 1e15. E1 is simulated from 15 to 30 KeV, and E2 is simulated from 60 to 90 KeV.

FIG. 4a shows simulated profiles for four conditions. Profile 44 results from E1=15 KeV and E2=60 KeV. Profile 46 results from E1=20 KeV and E2=70 KeV. Profile 48 results from E1=25 KeV and E2=80 KeV. Profile 50 results from E1=30 KeV and E2=90 KeV. For all these profiles, nominal junction depth 52, defined herein as the position where the concentration begins tailing off, is determined mainly by the LDD implant due to its 0° tilt. In general, however, junction depth would be determined by the high concentration portion 54 of the profiles, which is seen to move deeper into the substrate as E2 is increased. Higher E2 requires a deeper amorphous layer to suppress channeling of the second implant, so E1 is increased accordingly. Surface arsenic concentrations are 1–2e20 for all of the profiles.

FIG. 4b shows a comparison between a simulated arsenic profile 56 utilizing a prior art one step implant at dose 4e15 and energy of 40 KeV, and the simulated profile 44 utilizing a two step implant with E1=15 KeV and E2=60 KeV. Junction depth 52 is equivalent for the two profiles. High concentration portion 54 of profile 44 spreads slightly deeper than that of profile 56, due to the high value of E2. Surface arsenic concentration is considerably lower for profile 44.

Figure 5:
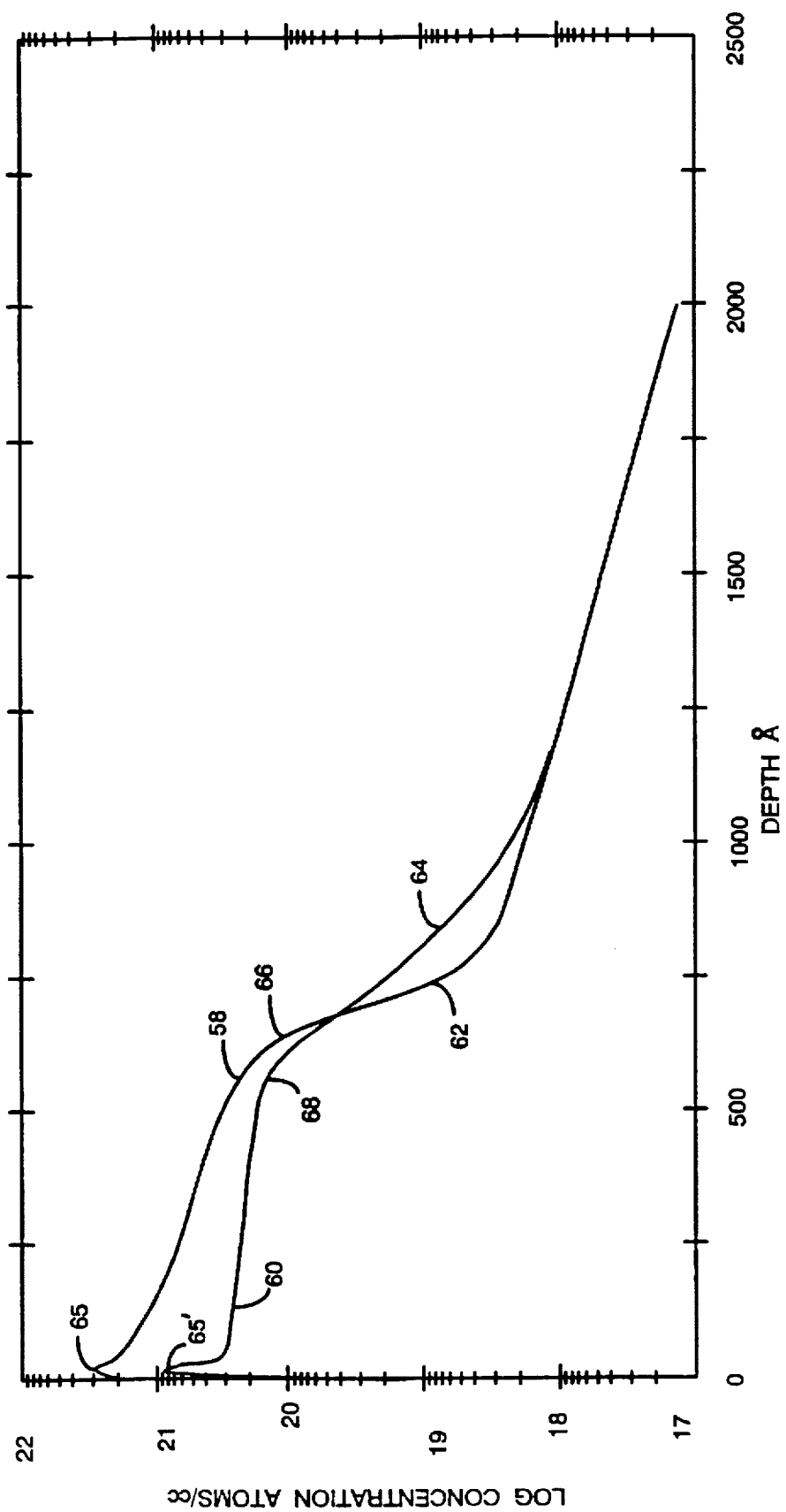
FIG. 5 shows SIMS depth profile data for arsenic source/drain implanted utilizing the prior art one step implant and the inventive two step implant process.

FIG. 5 shows experimental SIMS depth profile data for arsenic source/drains implanted through a 200 Angstrom screen oxide, utilizing the prior art one-step implant and the inventive 2-step implant processes. Profile 58 for sample 1 results from a prior art one step arsenic implant, with an implant dose of 5e15 and implant energy of 40 KeV. Profile 60 for sample 2 results from a two-step implant according to the inventive process, with a first implant dose of 5e14 and energy of 15 KeV, and a second implant dose of 1e15 and energy of 60 KeV. The total dose for sample 2 is 1.5e15. Junction 62 for profile 58 is close in position to junction 64 for profile 60, both of which occur at approximately 800 Angstroms. Peaks 65 and 65' are artifacts of the SIMS process. Ignoring the artifacts, by extrapolating profiles 58 and 60 to the surface, arsenic surface concentration for profile 58 is approximately 1e21 atoms/cc, whereas for profile 60 it is approximately 2.3e20, a factor of 4–5 lower. Little evidence of channeling is seen for either profile. This is particularly significant in the case of profile 60, performed at a higher implant energy at which channeling ordinarily degrades the as-implanted distribution. Profile 60 is substantially flatter than profile 58 for depths less than knee depths 66 and 68 of profiles 58 and 60 respectively.

Spreading resistance probe (SRP) measurements have been made to determine the concentration of electrically active arsenic for the two aforementioned samples of FIG. 5 after Rapid Thermal Anneal at 1050 degrees C for 30 seconds followed by 1000° C. for 30 seconds. Table 1 summarizes SRP and SIMS data for the two samples.

TABLE 1

Experimental SRP and SIMS data

| Sample # | Electrically active arsenic peak concentration (SRP) | Chemical arsenic surface concentration (SIMS) | % active arsenic (SRP/SIMS) |
|---|---|---|---|
| 1 | 1.70 E20 | 1.0 E21 | 17.0% |
| 2 | 1.30 E20 | 2.30 E20 | 56.5% |

The peak concentration of electrically activated arsenic, which is located at or just below the surface, is similar for the two samples, although the peak chemical concentration differs by almost an order of magnitude. This differential is reflected in the percentage of activation, which is 17% for the single step implant and 56.5% for the two step implant. These activation percentages would rise for higher temperature RTA, due to an increase in the solid solubility of arsenic in silicon at higher RTA temperatures.

The lowered surface arsenic concentration utilizing my invention will provide improved silicidation characteristics while retaining favorable source/drain junction characteristics such as low junction leakage. The use of a double implant provides a larger array of variable implantation parameters than does a single step implant. Junction depth, electrically active arsenic profile, and chemical arsenic profile can be optimized by varying energy and dose of each of the implants.

Whereas the invention as described utilizes a two step arsenic source/drain implant with the first implant having a dose of approximately 5e14 and energy of approximately 15 KeV, and the second implant having a dose of approximately 2e15 and energy of approximately 60 KeV, followed by Rapid Thermal Anneal at 1050 degrees C for 30 seconds, it is not to be limited to these particular parameter values. It is believed that the first implant dose may be in the range between 1e14–2e15, the first implant energy may be in the range between 2–40 KeV, the second implant dose may be in the range between 5e14–5e15, the second implant energy may be in the range between 10–90 KeV, and the implant anneal may be in the temperature range between 800–1100C. The surface chemical arsenic concentration may be in the range between 1e19–1e21, depending on the implant anneal temperature and the resulting solid solubility of arsenic in silicon at that temperature. It is also believed that in order to achieve acceptable silicide characteristics, the silicidation anneal temperature following titanium deposition would be 600–800 C. Rather, the scope of the invention should be construed in light of the claims.

With this in mind,

I claim:

1. An NMOS device in a surface of a silicon substrate, said device having a source/drain region therein comprising:

an arsenic-doped region extending into said silicon substrate from said surface, said arsenic-doped region having a leading edge below said surface;

a junction between said leading edge of said arsenic doped region and said substrate at a specified junction depth below said surface;

said device being made by a process comprising (1) implanting a first dose of arsenic into said silicon substrate with a first energy;

(2) implanting a second dose of arsenic into said silicon substrate with a second energy;

(3) annealing said silicon substrate at an anneal temperature;

(4) adjusting said first and second doses of arsenic and said first and second energies to provide a first profile of chemical arsenic concentration and a second profile of electrically active arsenic concentration in said arsenic-doped region following said annealing step and to provide said junction at said specified junction depth;

said first profile of chemical arsenic concentration being a non-Gaussian profile as a function of depth below said surface and said second profile of electrically active arsenic concentration being a non-Gaussian profile as a function of depth below said surface said chemical concentration at said surface being greater than and substantially within a factor of two of said electrically active arsenic concentration at said surface, said chemical concentration profile having a knee at a knee depth below said surface, and said chemical concentration profile being substantially flatter than a Gaussian profile for depths less than said knee depth, said chemical concentration being greater than said electrically active arsenic concentration for depths less than said knee depth, said electrically active arsenic concentration profile for depths less than said knee depth being substantially flat and substantially equal to the solid solubility limit of arsenic in silicon at said anneal temperature.

2. The NMOS device of claim 1, wherein:

said chemical arsenic concentration at said surface is in the range between 1e19–1e21;

said junction depth is in the range between 0.05–0.2 microns, and wherein the sheet resistance of said arsenic-doped region is in the range between 50–500 ohms per square;

said second arsenic energy is greater than said first arsenic energy;

said first arsenic dose and first arsenic energy are sufficiently high to form a disordered layer near said surface of said silicon wafer for inhibiting channeling during said second implantation step.

3. The NMOS device of claim 2, further comprising a layer of titanium silicide at the surface of said arsenic-doped region to form a contact to said arsenic-doped region.

4. The device of claim 13, wherein said process for making said device further comprises:

(1) providing said silicon substrate having a thin oxide layer thereon;

(2) annealing said substrate after said first and second implant at a first anneal temperature for a first time, wherein said first and second implant doses and said first and second implant energies are adjusted so as to provide a chemical concentration of said arsenic at said surface substantially equal to the solid solubility of arsenic in silicon at said first anneal temperature;

(3) removing said oxide layer;

(4) depositing a layer of titanium over said surface region;

(5) annealing said substrate at a second anneal temperature for a second anneal time, said second temperature and time being sufficiently high to react substantially all of said titanium with said silicon to form said titanium silicide layer over said surface region;

wherein said first anneal temperature is in the range between 800–1100 C, said second anneal temperature is in the range between 600 and 800C, said surface chemical arsenic concentration is in the range between 1e19–1e21, said first energy is in the range between 1e14–2e15, said first dose is in the range between 2–40 KeV, said second energy is in the range between 10–90 KeV, and said second dose is in the range between 5e14–5e15.

5. The device of claim 3, wherein:

the thickness of said titanium silicide layer is in the range between 200–1000 Angstroms, and wherein the sheet resistance of said titanium silicide layer is less than 20 ohms per square; and wherein said process for making said device further comprises:

(1) providing said silicon substrate having a thin oxide layer thereon;

(2) annealing said substrate at a first anneal temperature for a first time, wherein said first and second implant doses and said first and second implant energies are adjusted so as to provide a chemical concentration of said arsenic at said surface substantially equal to the solid solubility of arsenic in silicon at said first anneal temperature;

(3) removing said oxide layer;

(4) depositing a layer of titanium over said surface region;

(5) annealing said substrate at a second anneal temperature for a second anneal time, said second temperature and time being sufficiently high to react substantially all of said titanium with said silicon to form said titanium silicide layer over said surface region;

wherein said first anneal temperature is in the range between 800–1100C, and said surface chemical arsenic concentration is in the range between 1e19–1e21.

6. An NMOS device in a surface of a silicon substrate, said device having a source/drain region therein comprising:

an arsenic-doped region extending into said silicon substrate from said surface, said arsenic-doped region having a leading edge below said surface, said arsenic-doped region having been formed by ion implantation of arsenic atoms followed by post-implant anneal at an anneal temperature;

a junction between said leading edge of said arsenic doped region and said substrate at a specified junction depth below said surface;

said arsenic-doped region having a first non-Gaussian profile of chemical arsenic concentration as a function of depth below said surface and having a second non-Gaussian profile of electrically active arsenic concentration as a function of depth below said surface, said chemical concentration at said surface being greater than and substantially within a factor of two of said electrically active arsenic concentration at said surface, said chemical concentration profile having a knee at a knee depth below said surface, and said chemical concentration profile being substantially flatter than a Gaussian profile for depths less than said knee depth, said chemical concentration being greater than said electrically active arsenic concentration for depths less than said knee depth, said electrically active arsenic concentration profile for depths less than said knee depth being substantially flat and substantially equal to the solid solubility limit of arsenic in silicon at said anneal temperature.

7. The device of claim 12, wherein said junction depth is in the range between 0.08–0.2 microns.

8. The device of claim 12, further comprising a layer of titanium silicide at the surface of said arsenic-doped region to form a contact to said arsenic-doped region.

9. The device of claim 8, wherein the thickness of said titanium silicide layer is in the range between 200–1000 Angstroms, and wherein the sheet resistance of said titanium silicide layer is less than 20 ohms per square.

10. The device of claim 9, wherein said junction depth is in the range between 0.08–0.2 microns.

11. The device of claim 6, wherein said chemical arsenic concentration at said surface is in the range between 1e19–1e21.

12. The device of claim 11, where said junction depth is in the range between 0.05–0.2 microns, and wherein the sheet resistance of said arsenic-doped region is in the range between 50–500 ohms per square.

13. The device of claim 6, further comprising a layer of titanium silicide at the surface of said arsenic-doped region to form a contact to said arsenic-doped region.

14. The device of claim 13, wherein the thickness of said titanium silicide layer is in the range between 200–1000 Å, and wherein the sheet resistance of said titanium silicide layer is less than 20 ohms per square.

* * * * *